United States Patent [19]

Fuerniss

[11] Patent Number: 4,497,889
[45] Date of Patent: Feb. 5, 1985

[54] RELEASE COMPOUND IN NEGATIVE ACTING PHOTOPOLYMERIZABLE ELEMENT

[75] Inventor: Stephen J. Fuerniss, Sayre, Pa.

[73] Assignee: E. I. Du Pont de Nemours and Company, Wilmington, Del.

[21] Appl. No.: 544,036

[22] Filed: Oct. 24, 1983

Related U.S. Application Data

[63] Continuation-in-part of Ser. No. 358,702, Mar. 16, 1972, abandoned.

[51] Int. Cl.$^3$ .................. G03C 1/90; G03C 1/68
[52] U.S. Cl. .................. 430/260; 430/281; 430/905; 430/954
[58] Field of Search .................. 430/260, 954

[56] References Cited

U.S. PATENT DOCUMENTS 3,827,908  8/1974  Johnson et al. .................. 430/311
4,148,658  10/1974  Kondoh et al. .................. 430/260
4,278,752  7/1981  Gervay et al. .................. 430/281

Primary Examiner—Richard L. Schilling

[57] ABSTRACT

Improved release properties are obtained between a cover sheet and a supported negative acting radiation sensitive photopolymerizable composition by introduction into the composition a compound of the formula A—B, wherein A is substituted or unsubstituted alkyl or alkenyl of 6 to 24 carbon atoms, and B is a 5 or 6 atom aromatic or nonaromatic heterocyclic radical containing 2 or 3 heteroatoms taken from N, O, S or combination thereof, said radical optionally containing a six carbon fused aromatic ring, an alkali metal salt of a $\beta$ amino carboxylic acid or a bis alkali metal salt of a $\beta$, $\beta'$ amino dicarboxylic acid, wherein said release compound or mixture is present in said negative acting photopolymerizable composition in an effective amount sufficient to lower peel force to a value not greater than 75 grams.

9 Claims, No Drawings

RELEASE COMPOUND IN NEGATIVE ACTING PHOTOPOLYMERIZABLE ELEMENT

RELATED APPLICATION

This application is a continuation in part of Ser. No. 358,702 filed Mar. 16, 1972, now abandoned.

BACKGROUND OF THE INVENTION

This invention relates to photopolymerizable resist film and more particularly to such film in which improved release properties can be obtained.

U.S. Pat. No. 3,469,982 discloses a negative acting photopolymerizable film resist in which a photopolymerizable layer is sandwiched between a temporary support film and a temporary cover film. This film has gained widespread usage in the manufacture of printed circuits in which the cover film is removed, the photopolymerizable layer is laminated by heat and pressure to the surface, e.g., copper, of a substrate to be permanently modified, the layer is imagewise exposed to actinic radiation, the film support is removed, the unexposed areas of the layer are removed by solvent washout (development), and the resultant bared area of the copper surface is permanently modified, such as by etching or deposition of metal.

The patent discloses solution coating of a photopolymerizable composition onto the support film, followed by drying and then lamination of the resultant dry layer to a surface such as copper-clad printed circuit board to carry out the photoresist process. In commercial practice, however, the dried photopolymerizable layer, which must remain adhered to the support during storage and shipment, has always been supplied as a sandwich between the support film and a cover sheet. This has enabled the sandwich element to be rolled up upon itself by the photoresist manufacturer and be supplied to the user, e.g., printed circuit manufacturer, as a compact, easy to handle roll. The cover film permits the roll to be unrolled by the user without the cover film pressing the prior art photopolymerizable layer against the backside of the support film and causing that layer to adhere. In use, the cover film is stripped away and discharged, followed by the photoresist processing described above.

This type of photopolymerizable film sandwiched between a temporary support film and a temporary cover film can be formulated to be useful in solder mask applications wherein the photopolymerizable film is applied to portions of a printed circuit board surface to confine molten solder heated to a temperature of at least 230° C. to pad areas on the board and to prevent bridging between conductors during tinning operations and during soldering of components. A solder mask also functions to prevent or minimize corrosion of the bare copper conductors and as a dielectric to insulate certain components from adjacent circuitry. Since a solder mask remains on the finished circuit board, i.e., the solder mask is a permanent coating for the printed circuit, it usually is transparent to allow for ease of circuit inspection.

Prior to use of the photopolymerizable layer it is necessary to remove the cover sheet to allow the photopolymerizable layer to be applied to a substrate which may or may not contain circuitry.

The present invention is directed to the introduction of an additive into a negative acting photosensitive composition which will allow easier removal of the cover sheet.

Use of additives in photosensitive layers is known in the prior art. Additives useful in the present invention are known in U.S. Pat. No. 3,827,908 to improve adhesion of positive photoresist to oxide semiconductor surfaces.

SUMMARY OF THE INVENTION

The present invention is directed to a solvent-developable negative acting radiation sensitive photopolymerizable element comprising a support bearing a layer of negative acting photopolymerizable composition, useful in making printed circuits, and a cover sheet, said composition comprising:

(a) at least one addition polymerizable ethylenically unsaturated compound having a boiling point above 100° C. at normal pressure;

(b) an organic free radical-generating addition polymerization initiator activatable by actinic radiation in the ultraviolet-to-visible region of the spectrum and (c) a macromolecular organic polymeric binder, the improvement rendering the composition readily releasable from the cover sheet which comprises a release compound or mixture of the formula A—B wherein A is substituted or unsubstituted alkyl or alkenyl of 6 to 24 carbon atoms, and B is selected from the group consisting of an unsubstituted 5 or 6 atom aromatic or nonaromatic heterocyclic radical containing 2 or 3 heteroatoms taken from N, O, S or combination thereof, a hetercyclic radical having as the sole heterocyclic nucleus a 5 or 6 atom aromatic or nonaromatic heterocyclic nucleus containing 2 or 3 heteratoms taken from N,O,S or combination thereof, said nucleus substituted with a six carbon fused aromatic ring containing no substituents other than hydrogen, an alkali metal salt of a $\beta$ amino carboxylic acid or a bis alkali metal salt of a $\beta, \beta'$ amino dicarboxylic acid, wherein said release compound or mixture is present in said negative acting photopolymerizable composition in an effective amount sufficient to lower peel force to a value not greater than 75 grams.

DETAILED DESCRIPTION OF THE INVENTION

The introduction of an additive into the negative acting solvent developable radiation sensitive composition aids in removal of the cover sheet which protects the radiation sensitive composition, e.g., in storage. This additive is of the formula A—B wherein A—B is as previously defined a narrow class of A—B groups are where A is a straight chain alkyl or straight chain alkenyl of 6 to 24 carbon atoms, B is 1-hydroxyethyl-2-imidazolinyl, sodium propionate-3-amino, or bis-(sodium propionate)-3-imino.

Preferred A—B constituents are where A contains 6 to 18 carbon atoms and B is 1-hydroxyethyl-2-imidazolinyl. Examples of suitable compounds are where A is caprylic, oleic, alkyl derived from tall oil fatty acid or, alkyl derived from coconut oil fatty acid and B is 1-hydroxyethyl-2-imidazolinyl. Examples of compounds for other B constituents are where A is alkyl derived from coconut oil fatty acid and B is sodium propionate-3-amino and A is alkyl derived from tallow and B is bis-(sodium propionate)-3-imino.

Additional compounds within the scope of the present invention are 4-nonadecylpyrazole
1-(2-hydroxyethyl)-2-(6-methyldodecyl)-imidazoline
3-(10-phenylheptadecyl)-1,2,4-triazole
4-tridec-5-enyloxazole
2-(2-isopropyloctyl)-1,3,4-thiadiazole
3-(1-heptenyl)-benzotriazole
2-(9-chlorononyl)-pyrazine The release compounds above are present in an amount effective to result in a peel force not greater than 75 grams and preferably not greater than 25 grams. "Peel force" is measured in accordance with the procedure listed below in the section entitled "Testing Procedure". The compound or mixture of compounds is generally present in an amount of 1 to 10% by weight based on the total weight of the negative acting photopolymerizable composition. A more preferred range is 1 to 5% by weight and more preferably 2 to 4%.

The photopolymerizable compositions as described above are limited only in that the components must be compatible with one another, and they must be capable of being formed into dry layers. A preferred photosensitive composition except for the release additive is disclosed in U.S. Pat. No. 4,278,752, which disclosure is incorporated by reference herein. This patent discloses a preferred photopolymerizable composition which comprises: (a) up to four ethylenically unsaturated compounds, preferably two or three, 20 to 65% by weight; (b) up to three macromolecular organic polymeric binders, preferably two, 20 to 35% by weight, at least one binder containing at least 5% by weight acrylonitrile; and (c) an organic, free-radical generating addition polymerization initiator or initiator system activatable by actinic radiation in the ultraviolet to visible region of the spectrum, 0.4 to 10.0% by weight, the composition containing at least 5% by weight halogen, e.g., bromine, chlorine, covalently bonded to an aromatic moiety or a conjugated vinyl component. All the weight percentages are based on the total weight of the composition. Covalent bonded halogen is desirable if the composition is to be used for soldering applications so that the layer can withstand soldering without blistering or degradation as occurs when the halogen is not covalently bonded to one of the aforesaid components. Effective components are those wherein the halogen is covalently bonded to an aromatic moiety of at least one of the ethylenically unsaturated compound (a), polymeric binder (b) and initiator (c), or to at least one conjugated vinyl component, e.g., in either monomeric form or as a polymer such as 2-chlorobutadiene-1,3. Effective compounds are therefore aryl halides and conjugated vinyl halides. Compounds such as vinylidene chloride copolymers, e.g., vinylidene chloride/acrylonitrile copolymers, are undesirable for soldering applications because they are saturated compounds which lose hydrogen chloride upon heating. The presence of such compounds in the solder mask results in blistering or degradation of the solder mask. However such compounds are useful for use in making printed circuit where utility as a solder mask is not necessary.

The halogen can be present in the composition covalently bonded to one, two or three of the components described above or any combination thereof, many of which are illustrated in the examples of U.S. Pat. No. 4,278,752. In a particularly preferred composition, 10 to 50% by weight of the ethylenically unsaturated compounds are halogenated. At the lower level of halogen present in the composition up to 10% by weight of $Sb_2O_3$ can be present to further increase flame retardance in solder mask applications. Above the 10% by weight amount the desirable properties of the photopolymerizable element, e.g., adhesion, surface smoothness, etc., begin to degrade. As the amount of halogen in the composition increases, the quantity of $Sb_2O_3$ can be reduced or eliminated entirely.

The preferred radiation sensitive element comprises a photopolymerizable layer with a thickness of about 0.0003 inch (0.0008 cm) to about 0.01 inch (0.025 cm) having adhered thereto with low to moderate adherence a thin, flexible polymeric film support which transmits radiation actinic to the photopolymerizable layer. The other side of the photopolymerizable layer may have adhered thereto a protective cover sheet with less adherence to the layer than adherence between the support and the layer.

A suitable cover sheet which is removed prior to application or the radiation sensitive material to a substrate may be chosen from a wide variety of films composed of high polymers, e.g., polyamides, polyolefins, polyesters, vinyl polymers, and cellulose esters, and may have a thickness of from 0.00025 inch (~0.0006 cm) to 0.008 inch (~0.02 cm) or more. A preferred cover sheet is about 0.001 inch (~0.0025 cm) thick polyethylene. Cover sheets and their compositions are well known in the prior art.

A suitable support sheet may be chosen from the same group of high polymer films described above and may have the same wide range of thicknesses. If exposure is to be made before removing the strippable support, it must, of course, transmit a substantial fraction of the actinic radiation incident upon it. If the strippable support is removed prior to exposure, no such restrictions apply. A particularly suitable support is a transparent polyethylene terephthalate film having a thickness of about 0.001 inch (~0.0025 cm). Supports and cover sheets as described above provide good protection to the photopolymerizable layer.

The flexible, photopolymerizable layer is prepared from monomeric components, polymeric binder components, photopolymerization initiators and other additives set forth below. In the case of use of the composition for solder mask applications it is preferable that at least a minimum amount of halogen must be present and the binder preferably contains acrylonitrile to provide flexibility to the layer even after photoexposure and exposure to molten solder. A desirable range of acrylonitrile is 5 to 15%.

Suitable monomers having a boiling point greater than 100° C. at normal pressure which can be used as the sole monomer or in combination with others include the following: tribromophenoxy ethyl methacrylate, 1,5-pentanediol diacrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, 2,2-di(p-hydroxyphenyl)propane diacrylate, pentaerythritol tetraacrylate, 2,2-di(p-hydroxyphenyl)propane dimethacrylate, triethylene glycol diacrylate, polyoxyethyl-2,2-di(p-hydroxyphenyl)propane dimethacrylate, di-(3-methacryloxy-2-hydroxypropyl)ether of bisphenol-A, di-(2-methacryloxyethyl)ether of bisphenol-A, di(3-acryloxy-2-hydroxypropyl)ether of bisphenol-A, di(2-acryloxyethyl)ether of bisphenol-A, di(3-methacryloxy-2-hydroxypropyl)ether of tetrachloro bisphenol-A, di(2-methacryloxyethyl)ether of tetrachloro bisphenol-A, di-(3-methacryloxy-2-hydroxypropyl)ether of tetrabromo bisphenol-A, di-(2-methacryloxyethyl)ether of tetrabromo bisphenol-A, di-(3-methacryloxy-2-hydroxypropyl)ether of 1,4-butanediol, di-(3-methacryloxy-2-hydroxypropyl)ether of diphenolic acid, triethylene glycol dimethacrylate, polyoxypropyltrimethylol propane triacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerytritol tetramethacrylate, trimethylol propane trimethacrylate, 1,5-pentanediol dimethacrylate, diallyl fumarate, 1,4-benzenediol dimethacrylate, 1,4-diisopropenyl benzene, and 1,3,5-triisopropenyl benzene.

Also useful in the photopolymerizable layer is at least one of the following ethylenically unsaturated compounds having a molecular weight of at least 300. Preferred monomers of this type are: an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages and especially those wherein at least one and preferably most of such linkages are conjugated with a double bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures.

Suitable binders which can be used as the sole binder or in combination with others include the following: Polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; saturated and unsaturated polyurethanes; synthetic rubbers, e.g., butadiene/acrylonitrile, acrylonitrile/butadiene/styrene and/or bromostyrene, methyl methacrylate/acrylonitrile/butadiene/styrene copolymers, 2-chlorobutadiene/1,3-polymers, and sytrene/butadiene/styrene, styrene/isoprene/styrene block copolymers; polybromostyrene; polyethylene oxides of polyglycols having average molecular weights from about 4,000 to 1,000,000; epoxides, e.g., epoxides containing acrylate or methacrylate groups; copolyesters, e.g., those prepared from the reaction product of a polymethylene glycol of the formula HO(CH$_2$)$_n$OH, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehyde.

Preferred free-radical generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methyl-anthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; •-hydrocarbon substituted aromatic acyloins, including •-methylbenzoin, •-allylbenzoin and •-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenylimidazolyl dimers, e.g., 2-o-chlorophenyl-4,5-diphenylimidazolyl dimer, with hydrogen donors, and mixtures thereof as described in U.S. Pat. Nos. 3,427,161; 3,479,185 and 3,549,367, can be used as initiators.

Other useful additives include thermal inhibitors, colorants, plasticizers, fillers, etc. Some of the ingredients can act in a dual role. For example, in the monomer binder systems the ethylenically unsaturated photopolymerizable compound can also act as a plasticizer for the thermoplastic binder.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitroso dimers, e.g., 1,4,4-trimethyl-2,3-diazobicyclo[3,2,2]-non-ene-2,3-dioxide nitrobenzene and dinitrobenzene, p-toluquinone and chloranil.

Various dyes and pigments may be added to increase the visibility of the solder-resist image. Any colorant used, however, should preferably be transparent to the actinic radiation used.

As discussed above, preferred composition of radiation-sensitive photopolymerizable elements are especially useful as solder masks. They are particularly advantageous because they possess resistance to molten solder and flame retardance without the sacrifice of other properties, e.g., flexibility after exposure, adhesion, photospeed, electrical insulation, and moisture, heat, and solvent resistance needed for resist and solder mask functionality as a solder resist and permanent coating for printed circuits.

The negative acting radiation sensitive photopolymerizable compositions are solvent developable or processable as opposed to semi-aqueous or aqueous developable or processable composition.

The following example, wherein the weights are in percent unless otherwise indicated, illustrate the invention.

EXAMPLE

Test films were prepared using the following stock solution:

| Ingredient | Amount (gms) |
| --- | --- |
| Methylene Chloride | 203.0 |
| Epocryl ® 303 Resin di-(3-acryloxy-2-hydroxypropyl) ether of tetrabromo bisphenol-A | 24.9 |
| Pentaerythritol Triacrylate | 13.4 |
| Blendex ® 491 methyl methacrylate(46)/acrylonitrile (9)/butadiene(14)/styrene(31) resin | 32.6 |
| Lucite ® 147KNL methyl methacrylate(95)/ethyl methacrylate(5) copolymer | 9.0 |
| CP 19Y methyl methacrylate(92)/methacrylic acid(8) | 1.2 |
| Benzophenone | 6.0 |
| Michler's ketone | 0.5 |
| 3-Mercaptotriazole | 0.2 |
| RMP-25 Monastral ® green pigment (25 parts); methyl methacrylate(46)/ acrylonitrile(9)/butadiene(14)/ styrene(31) resin (75 parts) | 0.7 |

Various amounts of different release agents were added to the stock solution composition above. The solutions were then coated onto 0.001 inch polyethylene terephthalate film with a 0.015 inch doctor knife. The film was allowed to air dry and a 0.001 inch polyethylene cover sheet was laminated on the coating.

Testing Procedure

Films prepared as above were cut into strips 1 inch by 10 inches. The polyethylene cover sheet was partially lifted from the coating at one end. The polyethylene terephthalate film with coating was placed in the jaws of a properly calibrated Instron ® device and the polyethylene cover sheet was attached to the other jaw. The load required to remove the rest of the polyethylene from the coating was measured. In a similar manner, the load to remove the polyethylene terephthalate film could be measured by completely removing the polyethylene cover sheet from the strip and hot roll laminating the coating to a 2-inch by 10-inch copper panel. The polyethylene terephthalate film was partially lifted from the coating at one end and the copper board with coating was placed in the jaws of the Instron ® device. The polyethylene terephthalate film was attached to the other jaw and the load to remove the rest of the polyethylene terephthalate was measured. This load is equivalent to peel force employed supra.

The following are data obtained for different amounts of Monazoline ® CY additive:

| AMOUNT OF MONAZOLINE ® CY (WT %) | LOAD TO REMOVE POLYETHYLENE (GMS) | LOAD TO REMOVE POLYETHYLENE TEREPHTHALATE (GMS) |
| --- | --- | --- |
| 0 | 106 | greater than 500 |
| .5 | 94 | greater than 500 |
| 1.0 | 76 | greater than 500 |
| 2.0 | 26 | 67 |
| 4.0 | 5 | 8 |

By using this procedure, the following compounds were effective at improving the cover sheet release:

| COMPOUND | STRUCTURE |
| --- | --- |
| Monazoline ® CY | A = Caprylic |
| Monazoline ® T | A = Alkyl from tall oil fatty acid |
| Monazoline ® O | A = Oleic |
| Monazoline ® C | A = Alkyl from coconut oil fatty acid |
| B for the four compounds above is 1-hydroethyl-2-imidazolinyl | |
| Deriphat ® 151 | B = —NHCH$_2$CH$_2$COO$^\ominus$Na$^\oplus$ A = Alkyl from coconut oil fatty acids |
| Deriphat ® 154 | 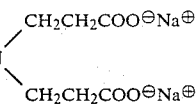 A = Alkyl from tallow |

What is claimed is:
1. In a solvent-developable negative acting radiation sensitive photopolymerizable element comprising a support bearing a layer of negative acting photopolymerizable composition, useful in making printed circuits, and a cover sheet, said composition comprising:
   (a) at least one addition polymerizable ethylenically unsaturated compound having a boiling point above 100° C. at normal pressure;
   (b) an organic free radical-generating addition polymerization initiator activatable by actinic radiation in the ultraviolet-to-visible region of the spectrum and
   (c) a macromolecular organic polymeric binder, the improvement rendering the composition readily releasable from the cover sheet which comprises a release compound or mixture of the formula A-B wherein
   A is substituted or unsubstituted alkyl or alkenyl of 6 to 24 carbon atoms, and
   B is selected from the group consisting of an unsubstituted 5 or 6 atom aromatic or nonaromatic heterocyclic radical containing 2 or 3 heteroatoms taken from N, O, S or combination thereof, a hetercyclic radical having as the sole heterocyclic nucleus a 5 or 6 atom aromatic or nonaromatic heterocyclic nucleus containing 2 or 3 heteroatoms taken from N,O,S or combination thereof, said nucleus substituted with a six carbon fused aromatic ring containing no substituents other than hydrogen,
   an alkali metal salt of a $\beta$ amino carboxylic acid or a bis alkali metal salt of a $\beta$, $\beta'$ amino dicarboxylic acid, wherein said release compound or mixture is present in said negative acting photopolymerizable composition in an effective amount sufficient to lower peel force to a value not greater than 75 grams.

2. The element of claim 1 wherein
   A is a straight chain alkyl or straight chain alkenyl of 6 to 24 carbon atoms,
   B is 1-hydroxyethyl-2-imidazolinyl, sodium propionate-3-amino, or bis-(sodium propionate)-3-imino.

3. The element of claims 1 or 2 wherein A contains 6 to 8 carbon atoms.

4. The element of claims 1 or 2 wherein B is 1-hydroxyethyl-2-imidazolinyl.

5. The element of claims 1 or 2 wherein A is caprylic, oleic, alkyl derived from tall oil fatty acid, or alkyl derived from coconut oil fatty acid.

6. The element of claim 1 wherein B is 1-hydroxyethyl-2-imidazolinyl-sodium propionate-3-amino or bis-(sodium propionate)-3-imino.

7. The element of claims 1 or 2 wherein said release compound or mixture is present in said negative acting photopolymerizable composition in an amount of 1 to 10% by weight.

8. The element of claims 1 or 2 wherein said release compound or mixture is present in an amount of 1 to 5% by weight.

9. The element of claims 1 or 2 wherein said release compound or mixture is present in an amount of 2 to 4% by weight.

* * * * *